United States Patent
Ruff et al.

(10) Patent No.: US 6,373,079 B1
(45) Date of Patent: Apr. 16, 2002

(54) THYRISTOR WITH BREAKDOWN REGION

(75) Inventors: Martin Ruff, Vestenbergsgreuth; Hans-Joachim Schulze, Ottobrunn, both of (DE)

(73) Assignee: Eupec Europaeische Gesellschaft fur Leistungshalbleiter mbH+CO.KG, Warstein-Belecke (DE)

( * ) Notice: Subject to any disclaimer, the term of this patent is extended or adjusted under 35 U.S.C. 154(b) by 0 days.

(21) Appl. No.: 09/281,692

(22) Filed: Mar. 30, 1999

Related U.S. Application Data

(63) Continuation of application No. PCT/DE97/02237, filed on Sep. 29, 1997.

(51) Int. Cl.⁷ .............................................. H01L 29/74
(52) U.S. Cl. ..................... 257/111; 257/131; 257/154; 257/156
(58) Field of Search ................................ 257/111, 131, 257/154, 156

(56) References Cited

U.S. PATENT DOCUMENTS

| | | | |
|---|---|---|---|
| 5,049,965 A | * 9/1991 | Schulze et al. | 257/156 |
| 5,243,205 A | 9/1993 | Kitagawa et al. | |
| 5,455,434 A | * 10/1995 | Pfirsch | 257/168 |
| 6,066,864 A | * 5/2000 | Ruff et al. | 257/175 |

FOREIGN PATENT DOCUMENTS

| | | |
|---|---|---|
| DE | 42 15 378 C1 | 9/1993 |
| EP | 0 343 369 A1 | 11/1989 |
| EP | 0 423 721 A2 | 4/1991 |
| EP | 0 572 826 A1 | 12/1993 |
| GB | 1 574 658 | 9/1980 |

OTHER PUBLICATIONS

International Publication WO 92/17907 (Schulze et al.), dated Oct. 15, 1992.

H.–J. Schulze et al.: "Light triggered 8 kV Thyristors with a New Type of Integrated Breakover Diode", ISPSD '96.

Paul D. Taylor: "Thyristor Design And Realization", John Wiley & Sons, Chichester, 1987, pp. 176–187.

H. Ohashi et al.: "Design consideration For High Power, Overvoltage Self–Protected Thyristor", IPEC—Tokyo '83, pp. 550–558.

* cited by examiner

Primary Examiner—Jerome Jackson, Jr.
(74) Attorney, Agent, or Firm—Herbert L. Lerner; Laurence A. Greenberg; Werner H. Stemer

(57) ABSTRACT

The thyristor is based on a semiconductor body with an anode-side base zone of the first conductivity type and one or more cathode-side base zones of the opposite, second conductivity type. Anode-side and cathode-side emitter zones are provided, and at least one region in the cathode-side base zone whose geometry gives it a reduced breakdown voltage as compared with the remaining regions in the cathode-side base zone and the edge of the semiconductor body. At the anode, below the region of reduced breakdown voltage, the thyristor has at least one recombination zone in which the free charge carriers have a reduced lifetime.

11 Claims, 5 Drawing Sheets

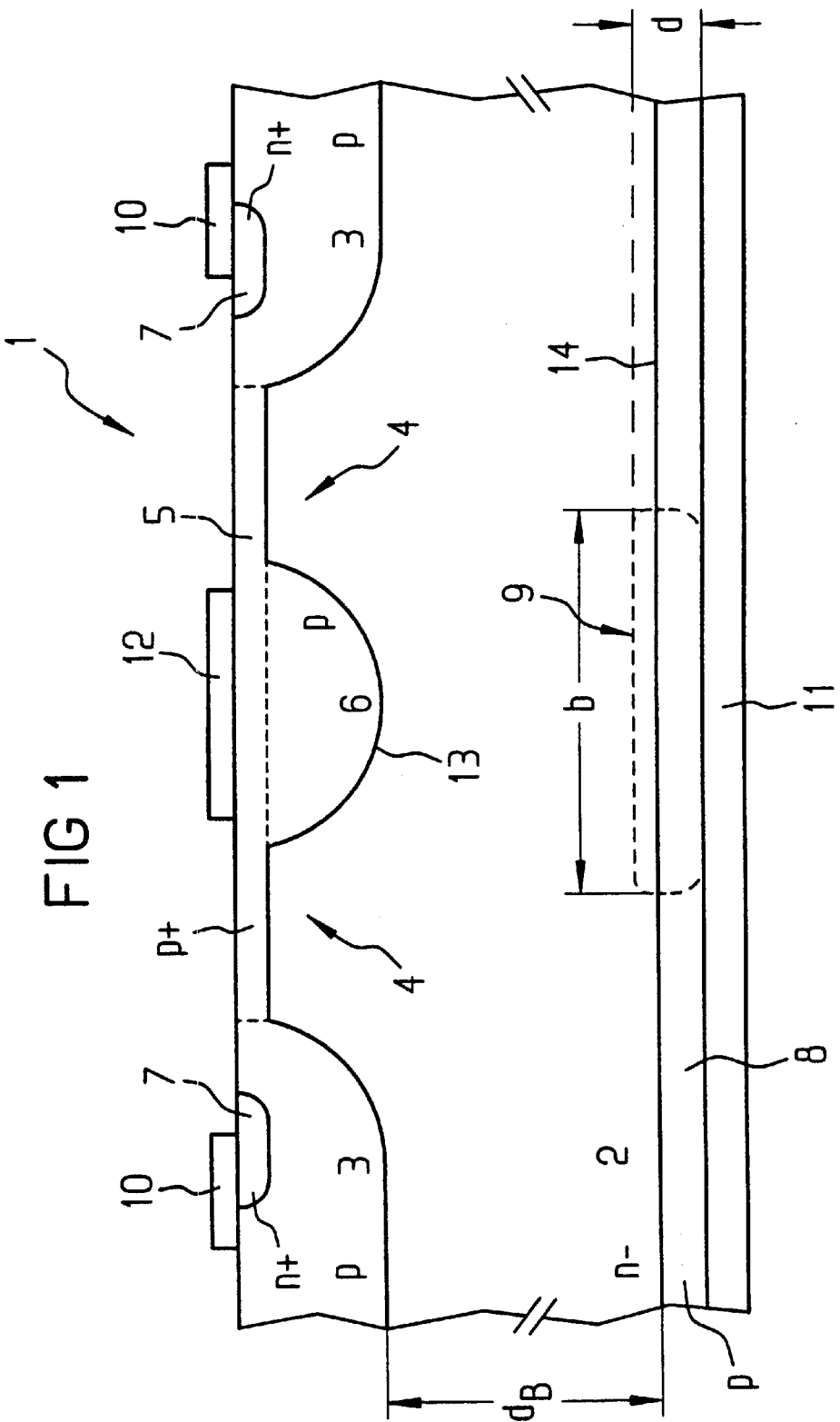

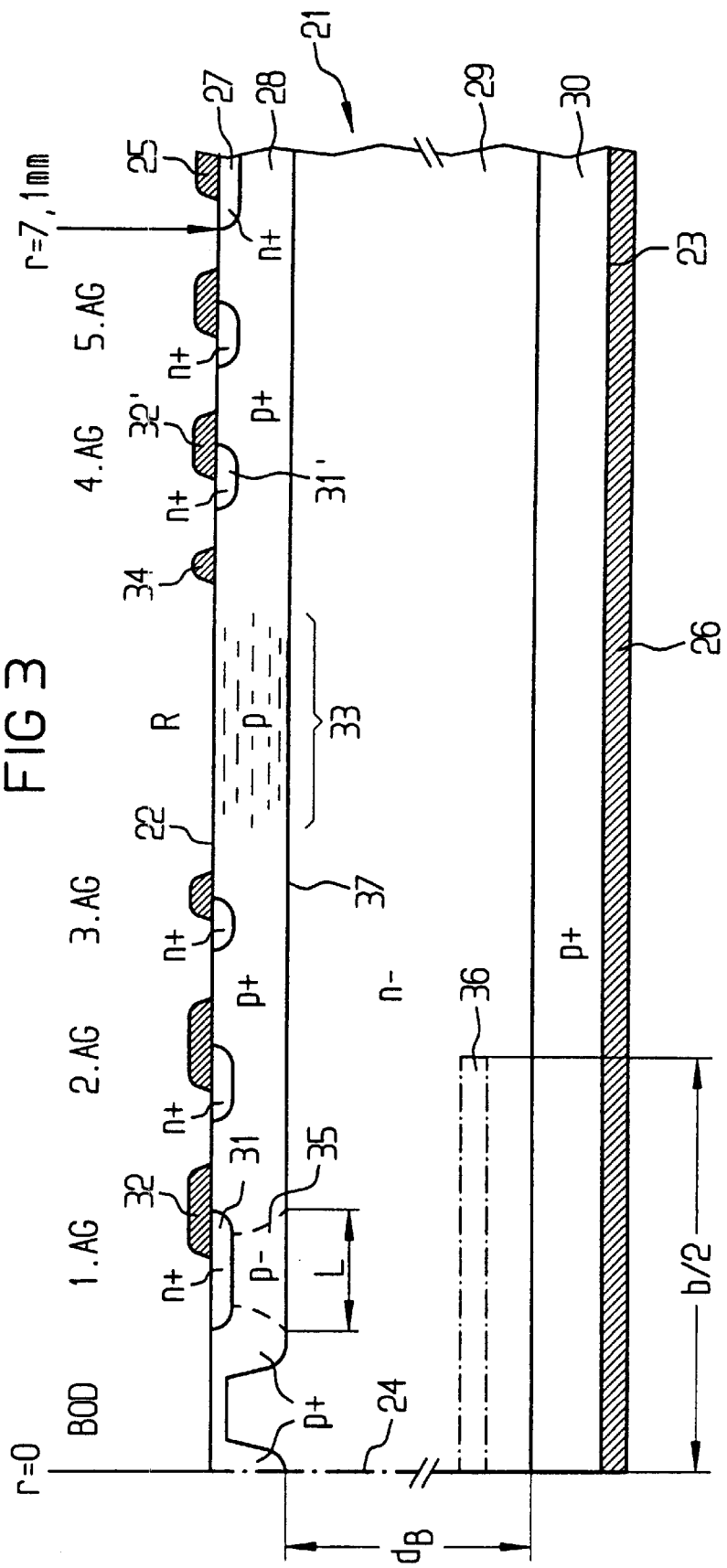

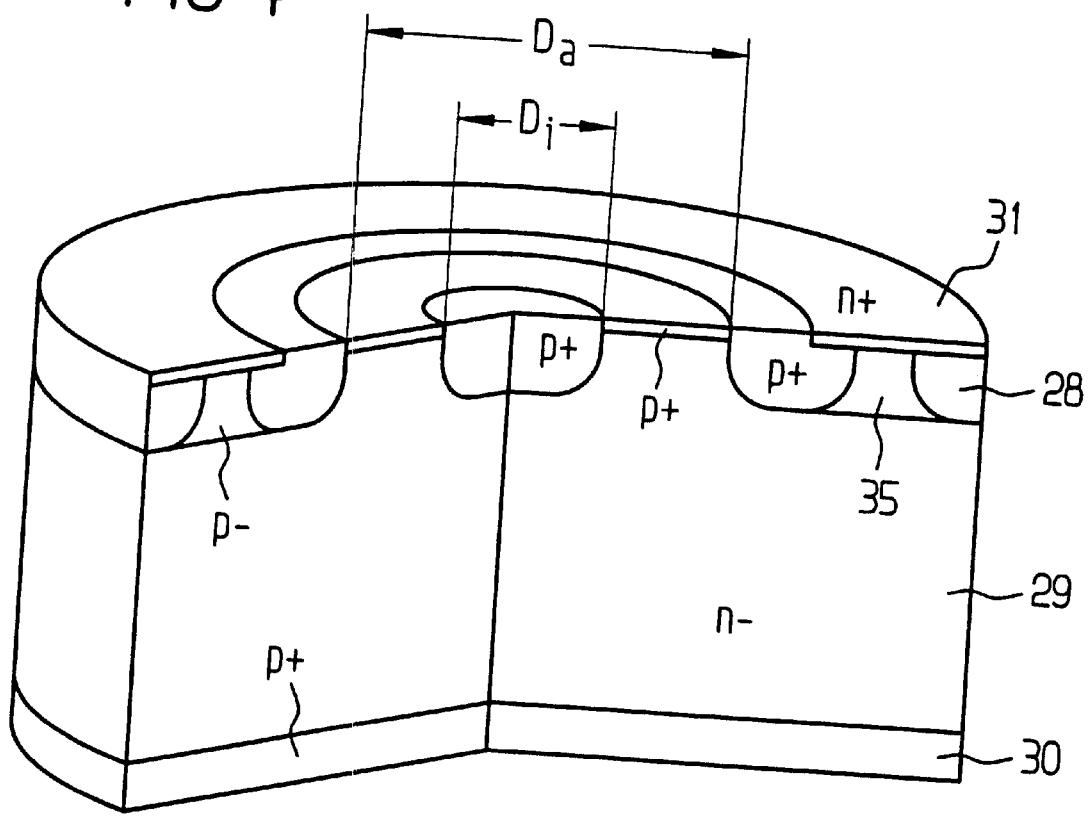

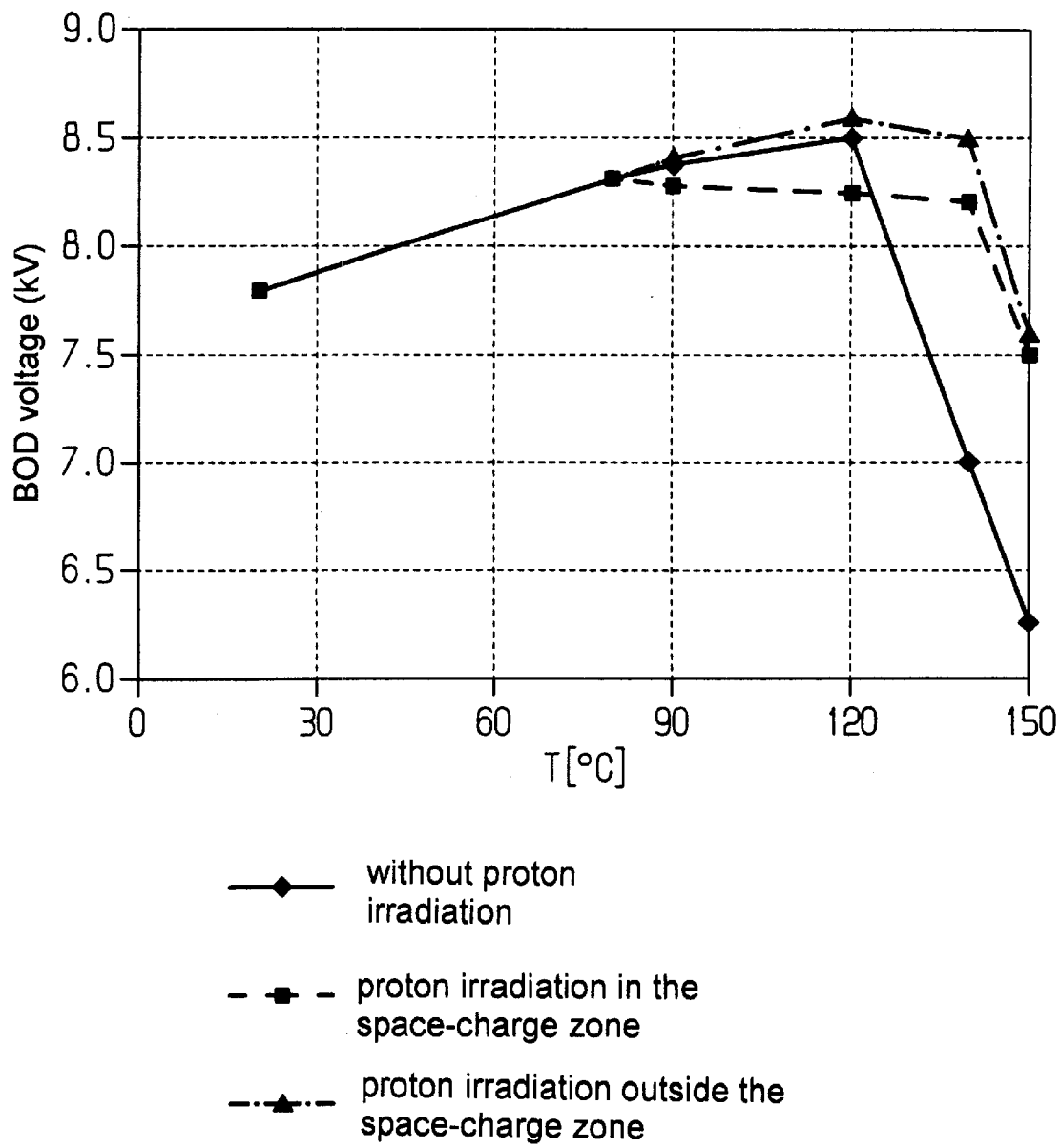

THYRISTOR WITH BREAKDOWN REGION

CROSS-REFERENCE TO RELATED APPLICATION

This is a continuation of copending International Application PCT/DE97/02237, filed Sep. 29, 1997, which designated the United States.

BACKGROUND OF THE INVENTION

Field of the Invention

The invention lies in the field of semiconductor technology. Specifically, the invention relates to a thyristor comprising a semiconductor body with
- an anode-side base zone of the first conductivity type and at least one cathode-side base zone of the opposite, second conductivity type;
- anode-side and cathode-side emitter zones; and
- at least one region in the cathode-side base zone whose geometry gives it a reduced breakdown voltage as compared with the remaining regions in the cathode-side base zone and the edge of the semiconductor body.

In high-voltage systems, a number of thyristors are generally connected in series. They need to be continually fired simultaneously. If one of the thyristors fires later, then it will have virtually the whole voltage across it, and the thyristor will be destroyed. Efforts are therefore being made to develop thyristors which can be triggered "at breakover," i.e. without base current. Such thyristors generally have a central region which has a lower breakdown voltage than the remaining region and the edge. If the voltage across the thyristor rises, this region enters avalanche breakdown and the breakdown current can trigger the thyristor directly or via one or more auxiliary thyristor structures.

The breakdown region may, for example, be produced by virtue of the fact that the cathode-side base zone has a cutout inside which a thinner layer of the same conductivity type is arranged on the surface of the semiconductor body. The pn junction between the anode-side base zone and the cathode-side base zone then has a defined radius of curvature at the transition from the horizontal to the cutout, this radius of curvature experiencing a field strength that is higher than a planar pn junction. Hence, it is preferable for the thyristor to break down at the curve. A structure of this generic type has been described, for example, in the article "Design consideration for high-power, overvoltage self-protected thyristor" by Ohashi, Yoshida, Yamaguchi, Akagi, published in IPEC-Tokyo 1983, pages 550–58, particularly with reference to FIG. 1b.

The breakdown characteristics of the region depend on the shape of the pn junction of the cathode-side base zone. U.S. Pat. No. 5,455,434 to Pfirsch (cf. DE 42 15 378 C1≙EP 0 572 826 A1) discloses a further thyristor of this generic type which has regions of reduced breakdown voltage. These regions of reduced breakdown voltage are very effective and can be reproduced easily.

The breakover voltage of thyristors having integrated overvoltage protection is highly temperature-dependent there, however. Reasons for this are, firstly, the breakdown voltage, which rises with temperature, and the emitter/collector gain $\alpha_{pnp}$, which increases with temperature. At high temperatures, the transistor gain $\alpha_{pnp}$ amplifies the reverse current in such a manner that the thyristor is triggered prematurely at a lower breakover voltage than intended. This can cause the thyristor to be triggered prematurely unintentionally.

European published application EP 423 721 describes a thyristor having a deformed region with a recombination zone. The deformed region has a reduced breakdown voltage on account of its geometry. Further semiconductor components of this generic type which are designed as thyristors and have a reduced breakdown voltage are described in international PCT publication WO 92/17907 and in European application EP 0 572 826.

SUMMARY OF THE INVENTION

It is accordingly an object of the invention to provide a thyristor with a breakdown region, which overcomes the above-mentioned disadvantages of the heretofore-known devices and methods of this general type and in which the breakover voltage of the thyristor is largely independent of temperature in the temperature range of the thyristor operation.

With the foregoing and other objects in view there is provided, in accordance with the invention, a thyristor, comprising:
- a semiconductor body formed with
- an anode-side base zone of a first conductivity type and at least one cathode-side base zone of a second conductivity type opposite the first conductivity type;
- anode-side and cathode-side emitter zones;
- a region in the cathode-side base zone having a geometry defining a reduced breakdown voltage as compared with remaining regions in the cathode-side base zone and an edge of the semiconductor body;
- a recombination zone formed at the anode below the region of reduced breakdown voltage, the recombination zone having free charge carriers with a reduced lifetime; and
- the regions in the cathode-side base zone having a defined geometry with the following features:
  - a central region of the cathode-side base zone having a cutout formed therein and including a thin layer of the second conductivity type inside the cutout on a surface of the semiconductor body, the layer being relatively thinner than and connected to the cathode-side base zone;
  - an additional zone of the second conductivity type formed in the cutout adjacent the thin layer; and
  - the additional zone, as viewed from the cathode-side base zone, being at least partly concave.

In other words, the recombination centers which reduce the lifetime of the free charge carriers are provided here at the anode beneath the zone of reduced breakdown voltage.

In accordance with an added feature of the invention, the recombination zone is formed with crystal lattice defects produced by irradiation. In a preferred embodiment, the crystal lattice defects are Frenkel defects or Schottky defects.

In accordance with an additional feature of the invention, the regions in the cathode-side base zone, the cathode-side base zone, and the cathode-side emitter zones are circular in a plane of the surface of the semiconductor body.

In accordance with a further feature of the invention, the thyristor is an annular thyristor.

In accordance with another feature of the invention, a doping concentration of the thin layer is very much higher than a doping concentration of the cathode-side base zone and of the additional layer.

In other words, the recombination zone is essentially composed of defects which are produced by irradiation with nondoping, high-energy particles. The defects are usually Frenkel defects or Schottky defects, which are produced during irradiation of the semiconductor body with α-particles or protons. Other defects are also conceivable, however. A relatively low dose of $10^{10}$ to $10^{12}$ cm$^{-2}$ is used for the irradiation, since the crystal should not be damaged too severely by the irradiation.

In accordance with again an added feature of the invention, the anode-side base zone has, in a vertical direction defined by a main surface normal to the semiconductor body, an inhomogeneous density distribution at recombination and generation centers for free charge carriers. In a preferred embodiment, the density of the recombination and generation centers within a first region of the anode-side base zone is higher than in regions of the anode-side base zone adjoining one another in the vertical direction on both sides and in each case extend as far as an adjacent pn junction.

In accordance with again an additional feature of the invention, the anode-side base zone has a vertical thickness $d_B$, and a dimension b of the first region satisfies the condition $d_B<b<2d_B$ in a lateral direction.

In accordance with again another feature of the invention, a vertical position of the first region within the anode-side base zone is chosen such that a space-charge zone of the pn junction associated with the two base zones extends as far as the first region when there is a predetermined potential difference between a cathode potential and an anode potential.

Preferably, the predetermined potential difference is approximately equivalent to a reduced breakdown voltage.

The further zone protects the surface of the thyristor against surface charges. This zone has a correspondingly higher doping than the base zone and the zone of reduced breakdown voltage.

With the above and other objects in view there is also provided, in accordance with the invention, a method of producing the above-outlined thyristor. In particular, the method is concerned with the fabrication of the recombination zone and comprises the following steps:

masking the anode of the semiconductor body, preferably with a perforated metal screen;
irradiating the anode, specifically with nondoping, high-energy particles such as protons or α-particles; and
subsequently heat treating for stabilizing the recombination zone.

If the irradiation is with protons, then the dosage is adjusted to a range from $10^{11}$ to $10^{13}$ cm$^{-2}$. If the irradiating particles are α-particles, then the dose is between $10^{10}$ and $10^{12}$ cm$^{-2}$.

Other features which are considered as characteristic for the invention are set forth in the appended claims.

Although the invention is illustrated and described herein as embodied in a thyristor with breakdown region, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 1 is a partial, diagrammatic section view of a thyristor according to the invention, having an anode-side recombination zone;

FIG. 3 is a diagrammatic cross section of a light-triggerable thyristor with integrated BOD and dU/dt protection;

FIG. 4 is a diagrammatic perspective view of a BOD structure, used for overvoltage protection, of the thyristor in FIG. 3; and FIG. 5 is a graph plotting the temperature dependency, calculated with the aid of a simulation program, of the BOD voltage for three thyristors of different design.

DESCRIPTION OF THE PREFERRED EMBODIMENTS

Figure 2A:
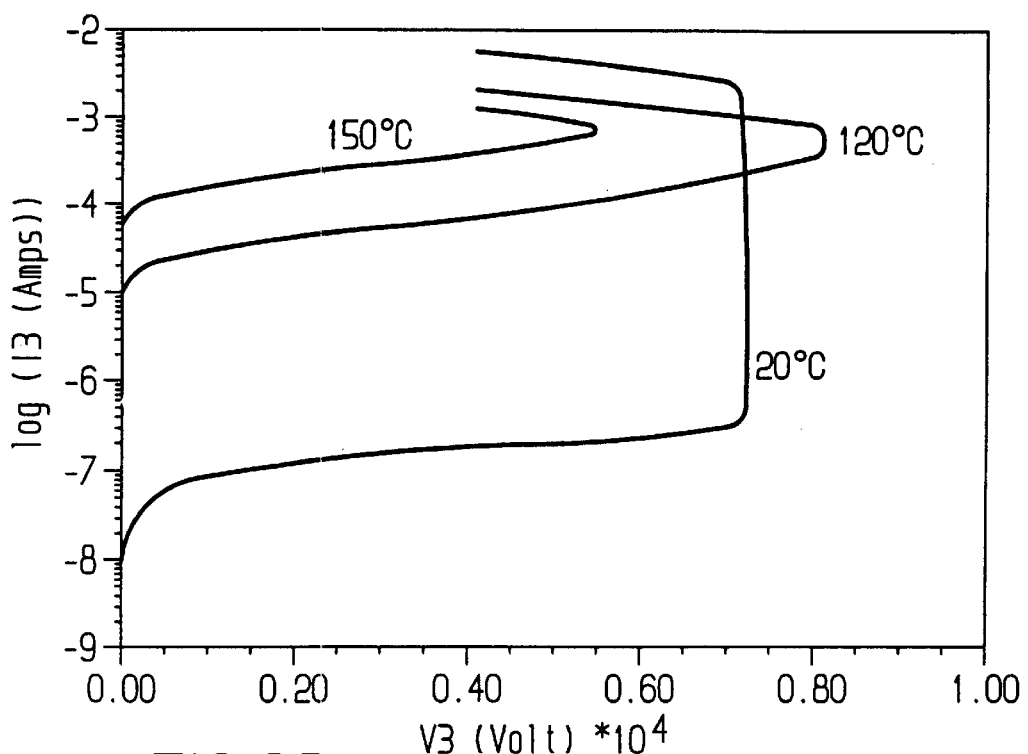
FIG. 2A is a graph plotting the breakover characteristic curve for a thyristor without a recombination zone (cf. U.S. Pat. No. 5,455,434)

Referring now to the figures of the drawing in detail and first, particularly, to FIG. 1 thereof, there is seen a partial section through a thyristor according to the invention.

Reference will now be had to a first exemplary embodiment of the invention:

A semiconductor body 1, for example a silicon wafer, contains an n$^-$-doped anode-side base zone 2. A p-doped base zone 3 adjoins at the cathode. The base zone 3 contains a cutout 4. The cutout 4 has a thin p$^+$-doped layer 5, connected to the base zone 3, arranged in it on the surface of the semiconductor body 1. Furthermore, an additional zone 6 of the same conductivity type as the cathode-side base zone 3 is arranged in the cutout 4. The additional zone 6 is connected to the thin layer 5 and has a spacing from the edge of the cutout 4, i.e. from the base zone 3, on all sides. The additional zone 6 has the shape of a section through a sphere, the sectional plane adjoining the thin layer 5. The thin layer 5 is preferably very much more highly doped than the base zone 3 and the additional zone 6. The shape of the regions 4, 5, 6 is not definitive, however. The essential point, though, is that, viewed from the inner zone 2, the additional zone 6 is at least partly concave. By virtue of its shape, the additional zone 6 has a reduced breakdown voltage as compared with the remaining regions in the cathode-side base zone 3 and the edge of the semiconductor body 1.

At the cathode, n$^+$-doped emitter zones 7, which may be the auxiliary emitter zones of auxiliary thyristors, for example, are embedded in the base zone 3. Contact is made with the emitter zones 7 by emitter electrodes 10. Furthermore, the emitter electrodes 10 also make contact with the base zone 3 on the outside. Contact is made with the thin layer 5 on the surface in the region of the additional zone 6 by a gate electrode 12.

The cathode-side base zone 3 and the emitter zone 7 as well as the thin layer 5 and the additional zone 6 are preferably of circular or annular design in the plane of the surface of the semiconductor body 1. The thyristor according to the invention is preferably an annular thyristor. The shapes illustrated for the above-mentioned zones and layers 3, 5, 6, 7 are not definitive, however. They may also differ from the circular shape or annular shape and be of polygonal design, for example.

The zones and layers described above may be designed as in the above-mentioned U.S. Pat. No. 5,455,434 to Pfirsch, in particular FIG. 1 thereof (the patent disclosure is herewith expressly incorporated by reference). There is specified a thyristor with integrated overvoltage protection. If a voltage is applied in the forward direction, charge carrier pairs are preferably formed in the region of the pn junction 13 of the additional zone 6, the electrons of the charge carrier pairs moving to the anode-side emitter zone 8 and the holes of said charge carrier pairs moving to the thin layer 5 and then to the emitter electrode via the base zone 3. This current is amplified in avalanche fashion and initiates triggering of the thyristor, as is known. The additional zone 6 thus forms a region having a reduced breakdown voltage, this region being predetermined by the geometry of the additional zone 6. The task of the thin layer 5 is to protect the surface of the thyristor at the cathode against surface charges. To this end, as already mentioned, it is more highly doped than the additional zone 6 and the base zone 3. Furthermore, U.S. Pat. No. 5,455,434 specifies a preferred method of producing the above-described thyristor structure.

In addition, a recombination zone 9 is provided at the anode in that region of the semiconductor body 1 which is located below the additional zone 6. The recombination zone 9 is produced by irradiating the anode of the semiconductor body 1 with nondoping, high-energy particles, particularly α-particles or protons. The irradiation produces defects in the crystal lattice at the anode. In particular, the defects are Frenkel defects and/or Schottky defects, other defects also being conceivable. The spatial distribution of these defects defines the recombination zone 9.

The vertical position of the zone 9 in the semiconductor body 1 is chosen such that the space-charge zone associated with the pn junction 13 does not extend as far as the damaged region even in the presence of the maximum blocking voltage $U_{BOD}$, which is predetermined by the central BOD structure 4/5/6. This is ensured if the radiation-induced recombination centers are predominantly localized in the anode-side emitter zone 8, the recombination zone 9 thus not extending, or extending only insignificantly, into the anode-side base zone 2. In the exemplary embodiment shown, the thickness d of the recombination zone 9 is $d \leq 150 \mu m$, for example, whereas the pn junction 14 separating the anode-side base zone 2 and the anode-side emitter zone 8 is at a depth of, typically, 70–100 $\mu m$. The width b of the recombination zone 9, measured in the lateral direction, should be roughly equivalent to 1–2 times the thickness dB of the anode-side base zone 2, that is to say should be roughly b≈1–4 mm.

A low irradiation dose is chosen for the irradiation, since the semiconductor body 1 should not be damaged too severely by the irradiation. The irradiation dose is typically in the range from about $10^{10}$ to $10^{12}$ cm$^{-2}$ in the case of irradiation with α-particles and from $10^{11}$ to $10^{13}$ cm$^{-2}$ in the case of irradiation with protons. Depending on the desired position of the recombination zone 9 in the anode-side p-type emitter zone 8 or n⁻-type base zone 2, the irradiation energy can be chosen between 5 and 20 MeV. If it is necessary to damage the crystal more severely, heavier particles such as oxygen ions may also be used for the irradiation. The irradiation source used is usually a high-energy ion implanter.

After irradiation, a heat-treatment step (for example 220° C., 20 h) is usually carried out to stabilize the recombination centers 9. The irradiation region can be chosen using a mask for the anode. Since these are usually very large structures, a perforated metal screen can be used as the mask, for example.

The operation of the thyristor structure according to the invention will be explained below.

The high-energy particles introduced at the anode in the recombination zone 9 produce a vertically inhomogeneous lifetime profile in the semiconductor body 1. In the recombination zone 9, the majority charge carrier life is severely reduced as compared with the remaining regions. The reduced lifetime causes intensified recombination of the charge carriers and thus a reduction in the transistor gain $\alpha_{pnp}$, particularly at high temperatures. As a result, the severe decrease in the breakover voltage can be shifted toward higher temperatures. The temperature shift can be influenced both by the size of the additional lifetime reduction and by its position.

Thyristors of the type mentioned can be either light-controlled or current-controlled via a gate electrode 12.

Figure 2B:
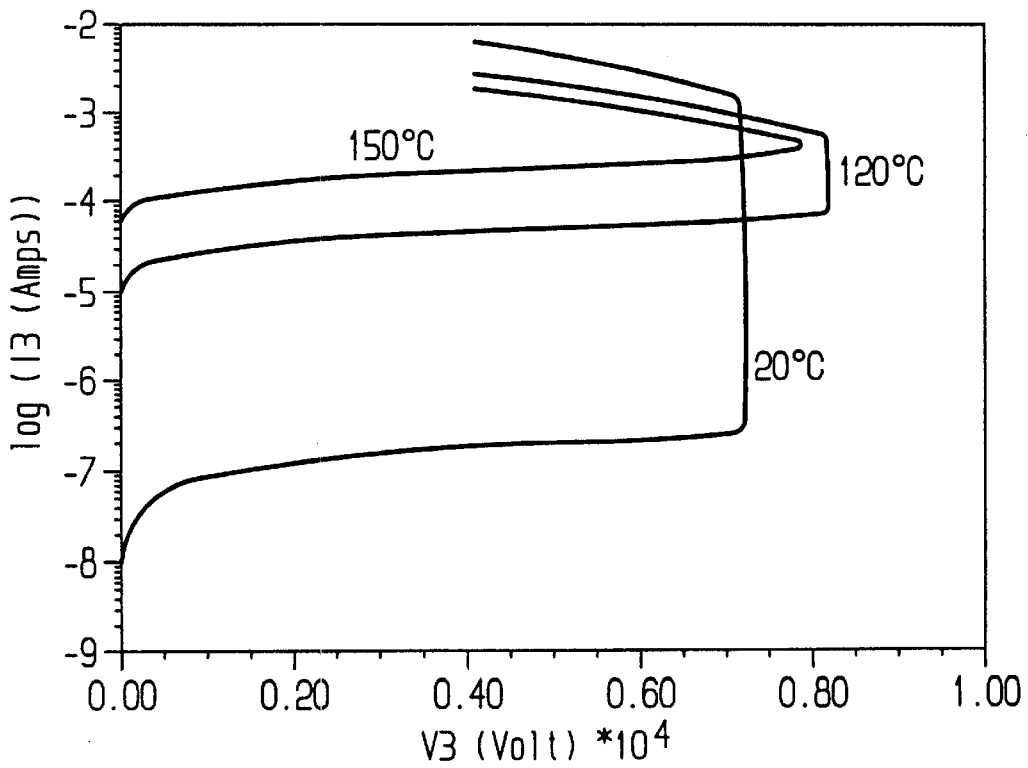
FIG. 2B is a graph plotting the breakover characteristic curve for a thyristor with a recombination zone on the backside of the wafer.

FIG. 2 shows the simulated current-voltage characteristic curve for breakover triggering of a thyristor of U.S. Pat. No. 5,455,434 to Pfirsch (FIG. 2A) as compared with the thyristor structure according to the invention, having an anode-side recombination zone, (FIG. 2B) at various temperatures. As shown in FIG. 2B, the carrier-life reduction in the recombination zone 9 makes the breakover voltage of the thyristors significantly more temperature-stable as compared with (FIG. 2A). The measures chosen thus make the breakover voltage of the thyristors according to the invention less temperature-dependent up to about 140° C. In the admissible operating temperature range, the thyristor thus does not lose its blocking capability.

Reference will now be had to a second exemplary embodiment of the invention:

If the temporal change dU/dt in the applied blocking voltage U exceeds a critical value of a several kV/μs, the thyristor described above fires before the steady-state breakover voltage $U_{BOD}$, which is predetermined by the central BOD structure 4/5/6, is actually reached. This misfire, which under certain circumstances leads to the destruction of the thyristor, is initiated by the buildup of the space-charge zone at the p-type base/n-type base junction 13 and the resultant displacement current $I_d=C_d \times dU/dt$ ($C_d$: voltage-dependent space-charge capacitance of the pn junction 13), which amplifies the reverse current. By incorporating a zone of increased resistance into the cathode-side base 3 below the first auxiliary thyristor 7/10, the misfire brought about by excessively large dU/dt loading can be moved into the central region of the thyristor in a targeted manner. Since the volume affected by the trigger then lies within that region which is bounded by the first auxiliary thyristor 7/10, the plasma can propagate over a large area and uniformly in the radial direction, as in the case of a controlled trigger, without the current density reaching critical values (see, for example, the publication by H.-J. Schulze et al. in Proceedings of the ISPSD 96, 197, Hawaii, 1996).

FIG. 3 shows a cross section of a light-triggerable thyristor with integrated dU/dt protection. That thyristor is rotationally symmetrical with respect to the axis 24 situated perpendicular to the two main surfaces 22/23 of the semiconductor body 21. Whereas the upper main surface 22 of the semiconductor body 21 in the form of a wafer bears the cathode metal coating 25, which runs at the edge and is provided with emitter short circuits, the back main surface 23 of said semiconductor body 21 is coated entirely with a metal coating 26 which is used as the anode. The semiconductor body 21, which is made of silicon, has a number of regions 27–30 which are doped differently and are each separated from one another by space-charge zones. These regions of different conductivity form the n⁺-doped, cathode-side emitter 27, the p-doped base 28, the anode-side base 29, which is only weakly electron-conducting, and the p⁺-type emitter 30, with which the anode metal coating 26 makes contact.

Denoted AG (amplifying gate), the auxiliary thyristors 1.–5.-AG, which are arranged radially within the cathode metal coating 25, form the driver stages of the main thyristor. They each have an n$^+$-doped auxiliary emitter 31/31' embedded in the cathode-side base 28, and a metal coating 32/32' which makes contact with both the auxiliary emitter 31/31' and the base 28. In a zone 33 which annularly encloses the three innermost auxiliary thyristors 1.–3.AG, the dopant concentration is reduced in comparison with the laterally adjoining regions of the cathode-side base 28. This annular zone 33 acts as a resistor R which limits the trigger current flowing radially outward in the base 28 to a predetermined maximum value and thus reduces the loading on the structure during the turn-on phase.

To move the trigger brought about by excessively large dU/dt loading into the central region of the thyristor in a targeted manner, the cathode-side base 28 has an increased resistance in an annular zone 35 situated below the n$^+$-doped region 31 of the first auxiliary thyristor 1.AG. Since the width L and the sheet resistance R□, provided by the dopant concentration, of the annular zone 35 decisively influence both the minimum radiation intensity required to trigger the first auxiliary thyristor 1.AG and the extent to which the latter can support dU/dt loading, suitable dimensioning of these parameters can be used to ensure that the centrally placed thyristor structure has the highest dU/dt sensitivity of the system and consequently triggers first if a critical value for the rate of voltage rise dU/dt is exceeded. The sheet resistance R" of the annular zone 35, which is about 200–600 μm wide, is typically R□≈2000–5000 Ω□. It is therefore greater than the sheet resistance of the adjoining base region (R□(p$^+$)≈200–400 Ω□) by a factor of 10–20.

The BOD structure, which has already been described above and is illustrated in an enlarged view in FIG. 4, of the thyristor is used for overvoltage protection. At $D_i$=350 μm and $D_a$=550 μm, its lateral dimensions are such that the breakdown voltage $U_{BOD}$ at room temperature T=23° C. is approximately $U_{BOD}$≈7.8 kV.

To keep the voltage $U_{BOD}$ ("breakover voltage"), which is predetermined by the geometry of the BOD structure, largely constant, particularly at relatively high operating temperatures T≧80–90° C., the anode-side base 29 has a vertically inhomogeneous distribution of the density of radiation-induced lattice defects in its central region below the BOD structure. The position of this comparatively narrow (about 20 μm wide) zone 36 in the semiconductor body 21, i.e. its vertical distance from the anode-side main surface 23, is chosen here such that the space-charge zone associated with the pn junction 37 extends as far as the damaged region 36 at a blocking voltage U≦$U_{BOD}$ of about U≈8.2 kV. If the blocking voltage U rises only insignificantly further, the damaged region 36 lies entirely within the space-charge zone, in which case the radiation-induced defects now no longer act as recombination centers but rather as generation centers for free charge carriers. The generation current, which contributes to the reverse current and rises exponentially with temperature, in the space-charge zone increases the gain factor $\alpha_{pnp}$ of the transistor structure formed by the layers 28/29/30 to such an extent that the thyristor triggers at a blocking voltage which is only insignificantly different than the desired breakdown voltage $U_{BOD}$. The vertically inhomogeneous distribution of the defect density in the anode-side base 29 is again produced by irradiation of the semiconductor body 21 with protons or helium nuclei. Apart from the method already described, the irradiation techniques disclosed in the PCT publication WO 92/17907 can also be used, in particular. The distance $b_D$/2 of the edge of the zone 36 from the axis of symmetry 24 is typically $b_D/2$≦(1–2) $d_B$, where $d_B$≈1–2 mm denotes the width of the anode-side base 29.

FIG. 5 shows the temperature dependency, calculated using a simulation program, of the breakover voltage $U_{BOD}$ for various thyristors. As expected, the voltage $U_{BOD}$ for the thyristor not irradiated with protons rises continually with temperature T at first on account of the positive temperature coefficient of the avalanche coefficients and then finally drops sharply after a temperature T≈120° C. (negative temperature coefficient of the transistor gain $\alpha_{pnp}$ owing to the increased reverse current). The temperature response of the BOD voltage is significantly improved if the thyristor has a zone, produced by irradiation with protons, with a reduced lifetime in the anode-side emitter (cf. the simulation values shown as triangles). A similar response is shown by the BOD voltage for a thyristor in which the zone having a reduced lifetime is localized in the anode-side base at a point not reached by the space-charge zone associated with the pn junction 37, irrespective of the blocking voltage that is present. The BOD voltage remains approximately constant in the temperature range 80° C.≦T≦140° C. if, in the presence of the desired blocking voltage of, for example, $U_{BOD}$≈8.2 kV, the zone with the increased defect density lies within the space-charge zone which starts from the p-type base/n-type base junction 37 (cf. the simulation values shown as squares).

We claim:

1. A thyristor, comprising:
   a semiconductor body formed with
   an anode-side base zone of a first conductivity type and at least one cathode-side base zone of a second conductivity type opposite the first conductivity type;
   anode-side and cathode-side emitter zones;
   a region in said cathode-side base zone having a geometry defining a reduced breakdown voltage as compared with remaining regions in said cathode-side base zone and an edge of said semiconductor body;
   a recombination zone formed at said anode below said region of reduced breakdown voltage, said recombination zone having free charge carriers with a reduced lifetime; and
   said regions in said cathode-side base zone having a defined geometry with the following features:
   a central region of said cathode-side base zone having a cutout formed therein and including a thin layer of the second conductivity type inside said cutout on a surface of said semiconductor body, said layer being relatively thinner than and connected to said cathode-side base zone;
   an additional zone of the second conductivity type formed in said cutout adjacent said thin layer; and
   said additional zone, as viewed from said cathode-side base zone, being at least partly concave.

2. The thyristor according to claim 1, wherein said recombination zone is formed with crystal lattice defects produced by irradiation.

3. The thyristor according to claim 2, wherein said crystal lattice defects are selected from the group consisting of Frenkel defects and Schottky defects.

4. The thyristor according to claim 1, wherein said regions in said cathode-side base zone, said cathode-side base zone, and said cathode-side emitter zones are circular in a plane of the surface of said semiconductor body.

5. The thyristor according to claim 1, wherein said thyristor is an annular thyristor.

6. The thyristor according to claim 1, wherein a doping concentration of said thin layer is very much higher than a doping concentration of said cathode-side base zone and of said additional layer.

7. The thyristor according to claim 1, wherein said semiconductor body has a defined surface normal, and said anode-side base zone has, in a vertical direction defined by said main surface normal, an inhomogeneous density distribution at recombination and generation centers for free charge carriers.

8. The thyristor according to claim 7, wherein the density of the recombination and generation centers within a first region of said anode-side base zone is higher than in regions of said anode-side base zone adjoining one another in the vertical direction on both sides and in each case extend as far as an adjacent pn junction.

9. The thyristor according to claim 8, wherein said anode-side base zone has a vertical thickness $d_B$, and a dimension b of the first region satisfies the condition $d_B<b<2d_B$ in a lateral direction.

10. The thyristor according to claim 8, wherein a vertical position of the first region within said anode-side base zone is chosen such that a space-charge zone of the pn junction associated with said two base zones extends as far as the first region when there is a predetermined potential difference between a cathode potential and an anode potential.

11. The thyristor according to claim 10, wherein the predetermined potential difference is approximately equivalent to a reduced breakdown voltage.

* * * * *

UNITED STATES PATENT AND TRADEMARK OFFICE
CERTIFICATE OF CORRECTION

PATENT NO.     : 6,373,079 B1
DATED          : April 16, 2002
INVENTOR(S)    : Martin Ruff et al.

It is certified that error appears in the above-identified patent and that said Letters Patent is hereby corrected as shown below:

<u>Title page,</u>
Insert:

-- [30]     Foreign Application Priority Data
    December 6, 1996     [DE]     Fed. Rep. of Germany     196 50 762.6 --

Signed and Sealed this

Tenth Day of June, 2003

JAMES E. ROGAN
*Director of the United States Patent and Trademark Office*